US012562772B2

(12) United States Patent
Zhu et al.

(10) Patent No.: US 12,562,772 B2
(45) Date of Patent: Feb. 24, 2026

(54) MAGNETIC COUPLING-BASED INTER-CHIP WIRELESS COMMUNICATION INTERFACE STRUCTURE AND METHOD FOR THREE-DIMENSIONAL STACKED CHIPS

(71) Applicants: ZHEJIANG UNIVERSITY, Zhejiang (CN); JCET GROUP CO., LTD., Jiangsu (CN)

(72) Inventors: Xiaolei Zhu, Hangzhou (CN); Chonghui Sun, Hangzhou (CN); Kun Yang, Hangzhou (CN); Rushuo Tao, Hangzhou (CN); Cheng Yang, Wuxi (CN)

(73) Assignees: ZHEJIANG UNIVERSITY, Zhejiang (CN); JCET GROUP CO., LTD., Jiangsu (CN)

( * ) Notice: Subject to any disclaimer, the term of this patent is extended or adjusted under 35 U.S.C. 154(b) by 332 days.

(21) Appl. No.: 18/393,698

(22) Filed: Dec. 22, 2023

(65) Prior Publication Data

US 2024/0171209 A1     May 23, 2024

(30) Foreign Application Priority Data

Dec. 22, 2022    (CN) .......................... 202211658035.5

(51) Int. Cl.
H04B 1/40 (2015.01)
H03F 3/217 (2006.01)

(52) U.S. Cl.
CPC ............. H04B 1/40 (2013.01); H03F 3/2173 (2013.01)

(58) Field of Classification Search
CPC ... H04B 1/38; H04B 1/40; H04B 5/20; H04B 5/24; H03F 3/20; H03F 3/217; H03F 3/2173; H03F 3/45273; H03K 5/22; H03K 5/249
See application file for complete search history.

(56) References Cited

U.S. PATENT DOCUMENTS

| | | | | |
|---|---|---|---|---|
| 11,989,050 B2 * | 5/2024 | Kashem | ................... | H03K 5/22 |
| 12,417,319 B2 * | 9/2025 | Chandra | .............. | H04L 9/3242 |

FOREIGN PATENT DOCUMENTS

| | | | | | |
|---|---|---|---|---|---|
| JP | | 2006013337 A | * | 1/2006 | ......... H01L 25/0657 |

OTHER PUBLICATIONS

"Three-Dimensional Semiconductor Device", JP 200601337 A, Saito et al., Jan. 12, 2006 (English Text). (Year: 2006).*

* cited by examiner

*Primary Examiner* — Quochien B Vuong
(74) *Attorney, Agent, or Firm* — JCIPRNET

(57) ABSTRACT

Disclosed are a magnetic coupling-based inter-chip wireless communication interface structure and method for three-dimensional stacked chips. The interface structure includes a master chip and at least one slave chip, wherein the master chip and all the slave chips are vertically stacked; the slave chip includes a clock receiving module, a data transmitting module, and a data receiving module; the master chip includes a clock transmitting module, a data transmitting module, and a data receiving module. The solution herein makes use of the magnetic coupling relationship between on-chip spiral inductors of different chips in a vertical direction to simultaneously transmit data and clock signals. The communication method herein modulates each bit of digital signal into a differential bi-directional non-return-to-zero pulse train and performs decision and data parsing at the receiving end by a high-speed dynamic comparator.

9 Claims, 4 Drawing Sheets

Clock transmitting H-bridge
5
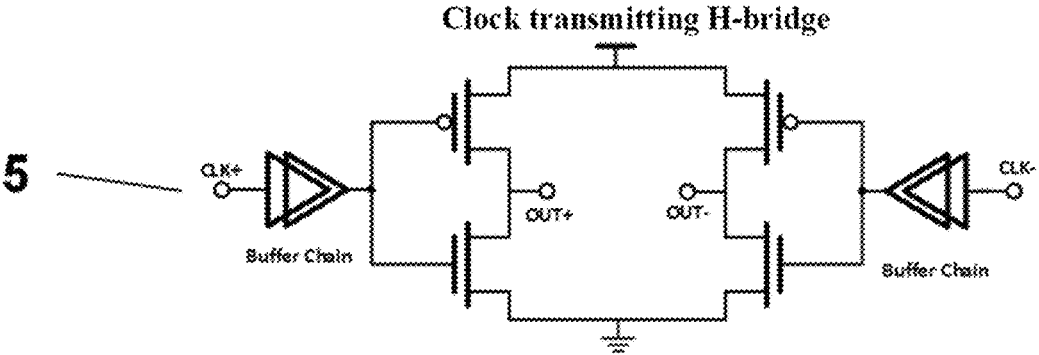
FIG. 2
Differential amplifier
6
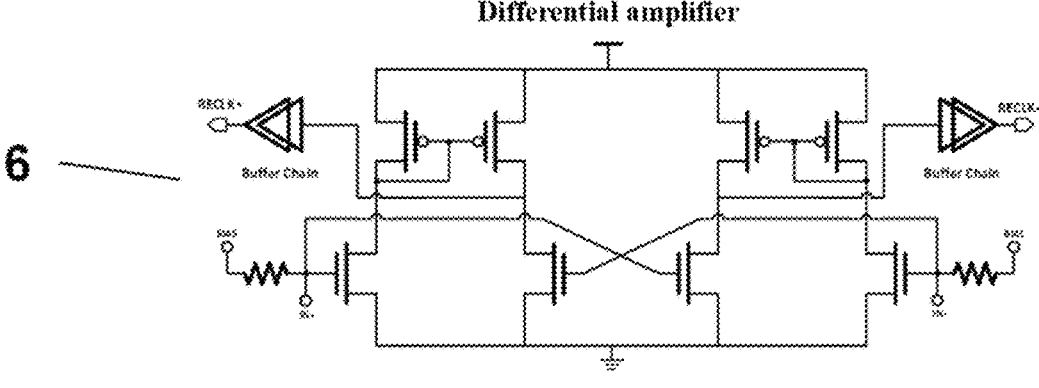
FIG. 3
Pulse wave delay generator 7
Full-bit data modulators 8 and 9
8
7
9
FIG. 4

Clocked dynamic comparator 10
RS latch 11

REDATA+

REDATA−

11

10

BIAS

IN−

IN+

BIAS

CLK

CLK

CLK

CLK

FIG. 5

MAGNETIC COUPLING-BASED INTER-CHIP WIRELESS COMMUNICATION INTERFACE STRUCTURE AND METHOD FOR THREE-DIMENSIONAL STACKED CHIPS

CROSS-REFERENCE TO RELATED APPLICATION

This application claims the priority benefit of China application serial no. 202211658035.5, filed on Dec. 22, 2022. The entirety of the above-mentioned patent application is hereby incorporated by reference herein and made a part of this specification.

BACKGROUND

1. Technical Field

The present disclosure relates to an inter-chip wireless communication interface structure and method for three-dimensional stacked chips and, more particularly, to a magnetic coupling-based inter-chip wireless communication interface structure for three-dimensional stacked chips.

2. Description of Related Art

With the increasing demand for high-performance floating-point computing chips and deep learning and reasoning chips, the integration of high-performance logic chips is upgrading and the process nodes are decreasing, but there is still a bottleneck of low bandwidth and small capacity of cache chips. Three-dimensional vertically stacked chips are becoming increasingly popular in high-performance consumer and industrial electronic devices for their high density and low latency.

With the rapid development of package technology, there have been some studies and reports on various ways to transfer data between chips in a vertical direction. According to current research, some applications use Through Silicon Via (TSV) to build wired data transmission between chips. Such solutions require expensive TSV procedures, and high-density TSV requires high-precision bonding between three-dimensional chips. Moreover, once an open circuit of TSV is caused due to a high-temperature operating environment and other factors, the system cannot be repaired. The use of magnetic coupling for three-dimensional stacked communications has also been reported. Such applications use modulation of binary data into asynchronous non-return-to-zero signals or non-return-to-zero pulses for wireless transmission, respectively, with high power consumption and poor interference resistance. In general, the existing research on high-speed data transmission between three-dimensional stacked chips has considerable disadvantages.

In a three-dimensional stacked package chip, the data or clock signal transmission and receiving inductors at different layers need only be aligned and assembled with low accuracy to establish a coupling relationship. This makes practical magnetic coupling data communication possible; modulation of each bit of data into a bidirectional differential pulse can significantly enhance the crosstalk resistance necessary for parallel magnetically coupled communication interfaces to communicate. The modem circuit based on this principle has a simple structure, low power consumption, and low error rate, but there has been no related application or report so far.

SUMMARY

To address the problems in the background art, the present disclosure provides a magnetic coupling-based inter-chip wireless communication interface structure for three-dimensional stacked chips. The solution herein integrates a three-dimensional stacked low-power multi-channel parallel high-speed data transceiving interface on a chip by cooperatively designing a clock/data transceiving planar spiral inductor and a data/clock bidirectional pulse transceiving circuit based on the principle characteristics of magnetic coupling that can transmit signals through a silicon substrate of the chip, full-bit modulation that can improve the anti-crosstalk ability, and pulse modulation that can reduce power consumption.

The technical solution of the present disclosure is as follows.

In a first aspect, the present disclosure provides a magnetic coupling-based inter-chip wireless communication interface structure for three-dimensional stacked chips, including a master chip and at least one slave chip, wherein the master chip and all the slave chips are vertically stacked; the slave chip includes a clock receiving module, a data transmitting module and a data receiving module; the master chip includes a clock transmitting module, a data transmitting module, and a data receiving module; on the slave chip and the master chip, the data transmitting modules are identical, and the data receiving modules are identical; the data transmitting module on the slave chip corresponds to the data receiving module on the master chip, and the data receiving module on the slave chip corresponds to the data transmitting module on the master chip; the data transmitting module and the data receiving module that correspond to each other establish a magnetic coupling relationship in a vertical direction between the data transmitting inductor and the data receiving inductor that are parallelly aligned for transmission of a voltage signal;

the clock transmitting module includes a clock transmitting inductor and a clock transmitting H-bridge; the clock receiving module includes a clock receiving inductor, a differential amplifier and a clock output buffer chain; the clock transmitting module and the clock receiving module establish a magnetic coupling relationship in a vertical direction between the clock receiving inductor and the clock transmitting inductor that are parallelly aligned for transmission of a voltage signal;

the clock transmitting inductor is connected to an output end of the clock transmitting H-bridge, and an external system clock is input to an input end of the clock transmitting H-bridge; the clock receiving inductor is connected to an input end of the differential amplifier, and a signal amplified by the differential amplifier is output to the clock output buffer chain;

the data transmitting module includes a rectangular wave pulse generator, a full-bit data modulator, and a data transmitting inductor, wherein the full-bit data modulator includes an H-bridge controller and a full-bit H-bridge; the data receiving module includes a data receiving inductor, a voltage-controlled clock delayer, a clocked dynamic comparator, and a latch;

the data transmitting inductor is connected to an output end of the full-bit data modulator, and a pulse generated by the rectangular wave pulse generator and a data signal to be transmitted are input to the full-bit data modulator; an output of the clock receiving module is connected to the voltage-controlled clock delayer, and an output delay clock signal of the voltage-controlled clock delayer and a signal received by the data receiving inductor are together output to the clocked dynamic comparator; the clocked dynamic comparator is connected to the latch and outputs a recovered data signal.

In a further aspect, the present disclosure provides a magnetic coupling-based inter-chip wireless communication method for three-dimensional stacked chips applied to the interface, including:

step 1), inputting an external system clock signal to the clock transmitting H-bridge of the master chip, sensing a periodic voltage signal with a same frequency as a system clock of the master chip by the clock receiving inductor of the slave chip, and amplifying the periodic voltage signal by a differential amplifier of the slave chip to recover the rectangular wave system clock; and step 2), sending the data signal from the data transmitting module of the master chip to the data receiving module of the slave chip, or sending from the data transmitting module of the slave chip to the data receiving module of the master chip, wherein the master chip or slave chip for transmitting data is referred to as a transmitting chip, the slave chip or master chip for receiving data is referred to as a receiving chip, and a process of sending the data signal includes:

2.1), using a transmitting chip clock to generate, by the data transmitting module of the transmitting chip, a rectangular pulse wave with a same frequency as the transmitting chip clock and a duty ratio of less than 50%;

2.2), passing the rectangular pulse wave generated by the transmitting chip in step 2.1) in a direction from a positive end to a negative end all through the data transmitting inductor therein by the data transmitting module of the transmitting chip in a time slot where the data to be transmitted is of a high level; likewise, in the time slot where the data to be transmitted is of a zero level, passing the rectangular pulse wave generated by the transmitting chip in step 2.1) all through the data transmitting inductor in a direction from the negative end to the positive end; and 2.3), passing a receiving chip clock through the voltage-controlled clock delayer by the receiving chip, so that a rising edge of the delay clock inside the receiving chip is synchronized to somewhere between first and second abrupt change points of an induced voltage on the data receiving inductor thereof; determining, by the clocked dynamic comparator of the receiving chip controlled by a synchronous delay clock, positive and negative nature of a differential induced voltage at both ends of the data receiving inductor, and outputting a comparison result as an analogue signal; sending the analogue signal output by the clocked dynamic comparator of the receiving chip to the latch of the receiving chip, and outputting a digital signal, which is the data signal received by the receiving chip.

Preferably, when the data signal is sent from the data transmitting module of the master chip to the data receiving module of the slave chip, the transmitting chip clock in step 2.1) is an external system clock input to the master chip; the receiving chip clock in step 2.3) is the rectangular wave system clock recovered by the slave chip in step 1);

when the data signal is sent from the data transmitting module of the slave chip to the data receiving module of the master chip, the transmitting chip clock in step 2.1) is the rectangular wave system clock recovered by the slave chip in step 1); the receiving chip clock in step 2.3) is an external system clock input to the master chip.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2 is a schematic diagram showing a structure of a clock transmitting H-bridge according to the present disclosure.

FIG. 3 is a schematic diagram showing a structure of a differential amplifier according to the present disclosure.

FIG. 4 is a schematic diagram showing structures of a rectangular-wave pulse generator, H-bridge control circuit, and full-bit modulated H-bridge according to the present disclosure.

FIG. 5 is a schematic diagram showing structures of a clocked dynamic comparator and RS latch according to the present disclosure.

DESCRIPTION OF THE EMBODIMENTS

The present disclosure will now be further described with reference to the accompanying drawings and examples.

Figure 1:
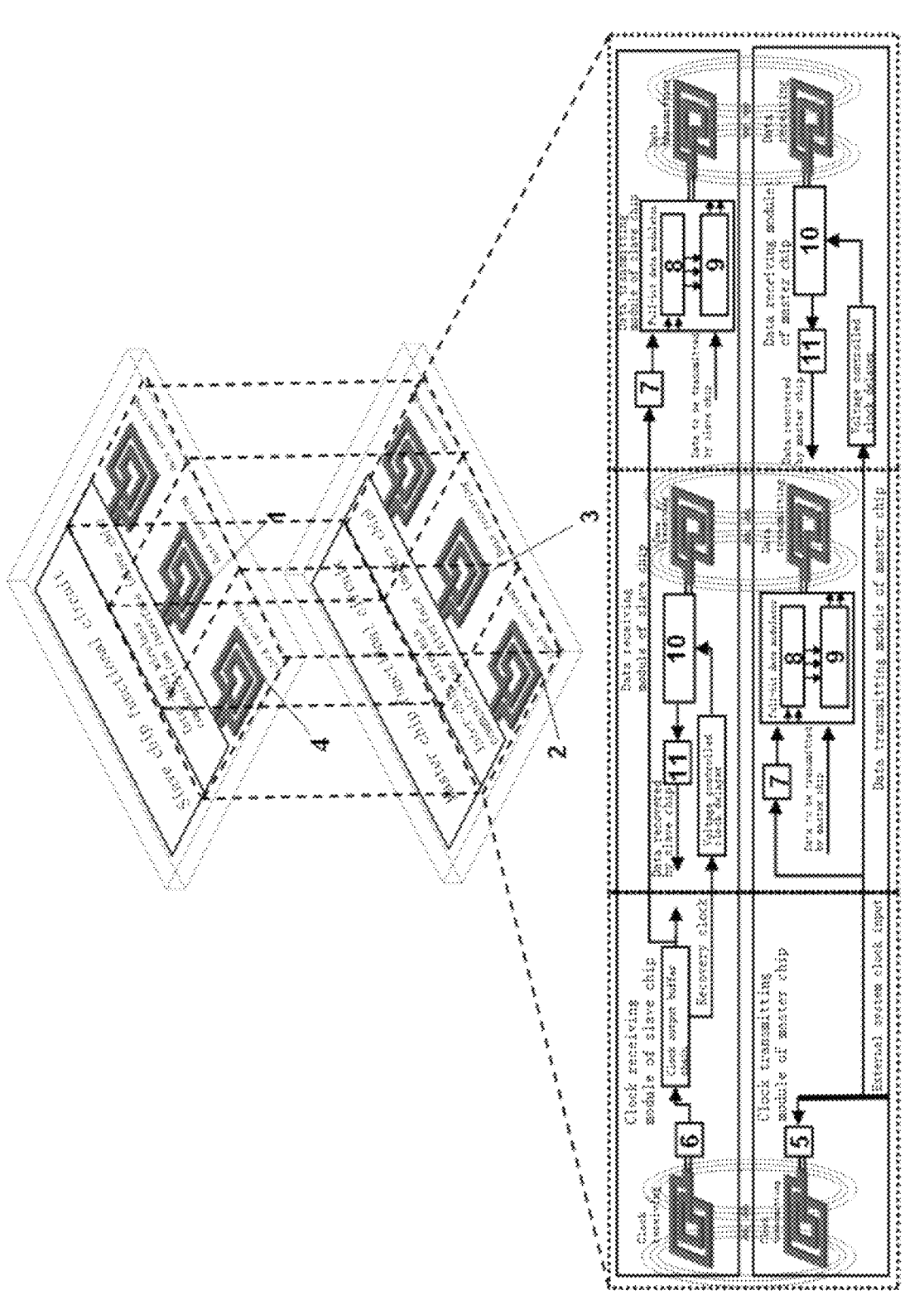
FIG. 1 is a schematic diagram showing an overall structure of an interface according to the present disclosure.

As shown in FIG. 1, the interface structure according to the present disclosure includes a master chip and at least one slave chip, wherein the master chip and all the slave chips are vertically stacked; the slave chip includes a clock receiving module, a data transmitting module and a data receiving module; the master chip includes a clock transmitting module, a data transmitting module, and a data receiving module; on the slave chip and the master chip, the data transmitting modules are identical, and the data receiving modules are identical; the data transmitting module on the slave chip corresponds to the data receiving module on the master chip, and the data receiving module on the slave chip corresponds to the data transmitting module on the master chip; the data transmitting module and the data receiving module that correspond to each other establish a magnetic coupling relationship in a vertical direction between the data transmitting inductor and the data receiving inductor that are parallelly aligned for transmission of a voltage signal;

With reference to FIGS. 2 and 3, the clock transmitting module herein includes a clock transmitting inductor 2 and a clock transmitting H-bridge 5; the clock receiving module includes a clock receiving inductor 4, a differential amplifier 6, and a clock output buffer chain; the clock transmitting module and the clock receiving module establish a magnetic coupling relationship in a vertical direction between the clock receiving inductor 2 and the clock transmitting inductor 4 that are parallelly aligned for transmission of a voltage signal; the clock transmitting inductor 2 is connected to an output end of the clock transmitting H-bridge 5, and an external system clock is input to an input end of the clock transmitting H-bridge 5; the clock receiving inductor 4 is connected to an input end of the differential amplifier 6, and a signal amplified by the differential amplifier 6 is output to the clock output buffer chain.

Figure 5:
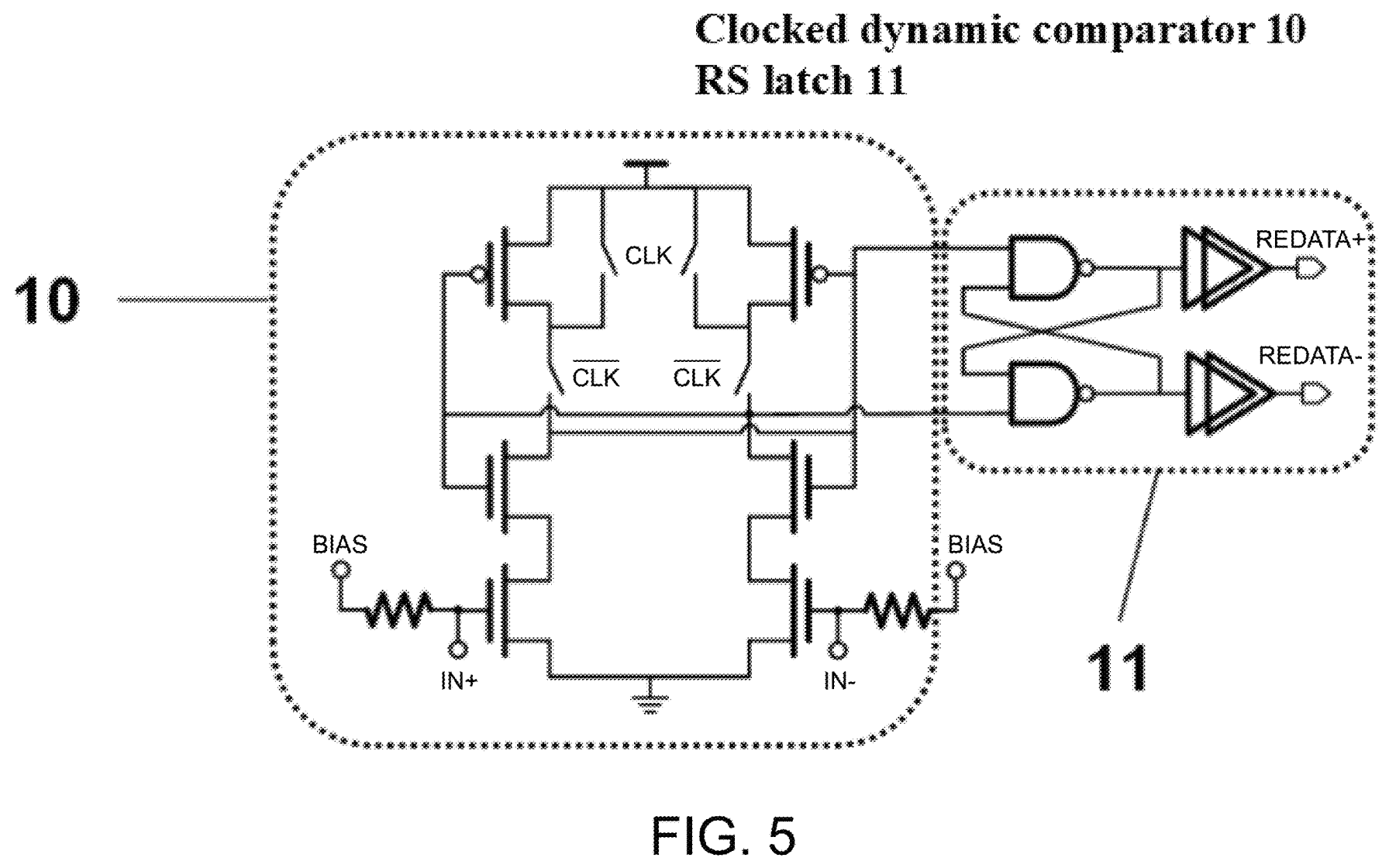

Referring to FIG. 4, the data transmitting module herein includes a rectangular wave pulse generator 7, a full-bit data modulator, and a data transmitting inductor 1, wherein the full-bit data modulator includes an H-bridge controller 8 and a full-bit H-bridge 9; with reference to FIG. 5, the data receiving module includes a data receiving inductor 3, a voltage-controlled clock delayer, a clocked dynamic comparator 10, and a RS latch 11; the data transmitting inductor 1 is connected to an output end of the full-bit data modulator, and a pulse generated by the rectangular wave pulse generator 7 and a data signal to be transmitted are input to the full-bit data modulator; an output of the clock receiving module is connected to the voltage-controlled clock delayer, and an output delay clock signal of the voltage-controlled clock delayer and a signal received by the data receiving inductor 3 are together output to the clocked dynamic comparator 10; the clocked dynamic comparator 10 is connected to the latch 11 and outputs a recovered data signal.

Within each layer of chips of the present disclosure, a spacing is maintained between data and clock channels.

As a preferred embodiment of the present disclosure, the data transmitting inductor (1), the data receiving inductor (3), the clock transmitting inductor (2) and the clock receiving inductor (4) are made of a top metal of the chip, and the data transmitting inductor (1), the data receiving inductor (3), the clock transmitting inductor (2) and the clock receiving inductor (4) are rectangular or octagonal planar spiral inductors with a self-resonant frequency higher than a transmitting frequency.

As shown in FIG. 2, the clock-transmitting H-bridge circuit includes a symmetrical pair of inverters; both ends of the clock transmitting inductor are respectively connected to output ends of the pair of inverters of the clock transmitting H-bridge; the pair of inverters is driven by a pair of differential rectangular wave system clocks. In an embodiment of the present disclosure, the clock receiving inductor is connected to an input end of an active load differential pair amplifier, and an output end of the differential pair is output via an output buffer inverter chain; the system clock is input to the rectangular wave pulse generator, the generated rectangular wave pulse signal and binary data to be transmitted are sent to an H-bridge control circuit, and the H-bridge control circuit sends the generated digital control signal to four control gates of a full-bit modulation H-bridge. Both ends of the transmitting inductor are respectively connected to drain outputs on both arms of the full-bit modulation H-bridge; a rectangular wave pulse generating circuit outputs a rectangular wave pulse having a duty ratio of 20% with the same frequency as the input clock. The input clock and the input clock after passing through an inverter delay chain are jointly connected to a NAND gate and output the rectangular wave pulse; the full-bit modulation H-bridge is composed of two pairs of fully symmetric PMOS and NMOS with drains connected together, wherein a source of the PMOS is connected to a power supply, and a source of the NMOS is grounded; the H-bridge control circuit is connected to the four gate inputs of the PMOS and NMOS on the left and right arms of the full-bit modulation H-bridge. The data signal to be transmitted is input to a PMOS gate on the left arm via an inverter; the data signal to be transmitted is directly connected to the PMOS gate on the right arm; the data signal to be transmitted and the generated rectangular wave pulse are output to a NMOS gate on the left arm via a NOR gate; an opposite signal of the data signal to be transmitted and an opposite signal of the generated rectangular wave pulse are output to the NMOS gate on the right arm via the NOR gate. Both ends of the receiving inductor are respectively connected to two comparison input ends of the clocked dynamic comparator. A recovery clock output via the clock receiving module is connected to the voltage-controlled delay circuit and outputs a synchronized clock to a clock input end of the clocked dynamic comparator. The differential outputs of the modules of the clocked dynamic comparator are connected to an RS latch and output as binary received data. The clocked dynamic comparator is a high-speed comparator that performs a precharge-compare procedure through clocking in one comparison cycle. In the embodiment of the present disclosure, a Strong-Arm dynamic comparator with good DC input bias is employed.

As a preferred embodiment of the present disclosure, the voltage-controlled clock delayer is a delay circuit where voltage controls delay time or phase without changing a signal frequency and a duty cycle. In an example of the present disclosure, a voltage-controlled delay circuit consisting of a chain of voltage-controlled current source-driven inverters and an output buffer is used.

As a preferred embodiment of the present disclosure, the clocked dynamic comparator 10 is a high-speed comparator for implementing a pre-charging state and comparing differential inputs of a state flow in a working cycle controlled by high and low levels of a clock; a polarity and magnitude of an output differential level of the clocked dynamic comparator are positively related to the magnitude and magnitude of an amplitude difference of an input differential signal in a comparison state.

As shown in FIG. 2, the present disclosure provides a magnetic coupling-based inter-chip wireless communication method for three-dimensional stacked chips applied to the interface structure, including:

step 1), inputting an external system clock signal to the clock transmitting H-bridge 5 of the master chip, sensing a periodic voltage signal with a same frequency as a system clock of the master chip by the clock receiving inductor 4 of the slave chip, and amplifying the periodic voltage signal by differential amplifier 6 of the slave chip to recover the rectangular wave system clock; and step 2), sending the data signal from the data transmitting module of the master chip to the data receiving module of the slave chip, or sending from the data transmitting module of the slave chip to the data receiving module of the master chip, wherein the master chip or slave chip for transmitting data is referred to as a transmitting chip, the slave chip or master chip for receiving data is referred to as a receiving chip, and a process of sending the data signal includes:

2.1), using a transmitting chip clock to generate, by the data transmitting module of the transmitting chip, a rectangular pulse wave with a same frequency as the transmitting chip clock and a duty ratio of less than 50%;

2.2), passing the rectangular pulse wave generated by the transmitting chip in step 2.1) in a direction from a positive end to a negative end all through the data transmitting inductor 1 therein by the data transmitting module of the transmitting chip in a time slot where the data to be transmitted is of a high level; likewise, in the time slot where the data to be transmitted is of a zero level, passing the rectangular pulse wave generated by the transmitting chip in step 2.1) all through the data transmitting inductor 3 in a direction from the negative end to the positive end; and 2.3), passing a receiving chip clock through the voltage-controlled clock delayer by the receiving chip, so that a rising edge of the delay clock inside the receiving chip is synchronized to somewhere between first and second abrupt change points of an induced voltage on the data receiving inductor 3 thereof; determining, by the clocked dynamic comparator 10 of the receiving chip controlled by a synchronous delay clock, positive and negative nature of a differential induced voltage at both ends of the data receiving inductor 3, and outputting a comparison result as an analogue signal; sending the analogue signal output by the clocked dynamic comparator 10 of the receiving chip to the latch 11 of the receiving chip, and outputting a digital signal, which is the data signal received by the receiving chip.

It is to be noted that when the data signal is sent from data transmitting module of the master chip to the data receiving module of the slave chip, the transmitting chip clock in step 2.1) is an external system clock input to the master chip; the receiving chip clock in step 2.3) is the rectangular wave system clock recovered by the slave chip in step 1); and when the data signal is sent from the data transmitting module of the slave chip to the data receiving module of the master chip, the transmitting chip clock in step 2.1) is the rectangular wave system clock recovered by the slave chip in step 1); the receiving chip clock in step 2.3) is an external system clock input to the master chip.

A model of on-chip planar spiral inductor can be approximated as an ideal inductor L in series connection with a small resistor R and then in parallel combination with a capacitor C. A conducting loop of the H-bridge can be considered as a series connection of two ideal switches and two internal resistances of switch MOS transistors, where a sum of the internal resistances of the switches is $R_{on}$. In a case where the transmitted data is of a high level, in a rectangular pulse wave period T, the data transmitting inductance and the voltage polarity at both ends of the internal resistance of the switch transistor are:

$$V_L = V_{cc}[u(t) - u(t - t_0)]$$

$$0 \leq t < T$$

where u(t) is a step function, and $t_0$ is the time when the rectangular wave pulse is of a high level.

$$V_L \xrightarrow{Laplace} \frac{V_{cc}(1 - e^{-st_0})}{s}$$

Therefore, regardless of the influence of the data receiving inductance on the transmitting inductance, the current flowing through the data transmitting inductor can be approximately described as:

$$I(s) = \frac{V_{cc}(1 - e^{-st_0})}{s} \bigg/ \left( R_{on} + \frac{\frac{1}{sC}(sL + R)}{\frac{1}{sC} + sL + R} \right)$$

In general, in a case where the data transmitting frequency is much less than a self-resonant frequency of the transmitting inductance, C in the equation can be ignored, where $R_{on}$ and R in series can be combined into $R_{eq}$ when calculating the current:

that is, $$I(s) = V_{cc}(1 - e^{-st_0}) \left( \frac{\frac{1}{R_{eq}}}{s} - \frac{\frac{1}{R_{eq}}}{s + \frac{L}{R_{eq}}} \right)$$

through inverse transformation, the equation below is derived:

$$I(t) = \begin{cases} \dfrac{V_{cc}}{R_{eq}}\left(1 - e^{-\frac{R_{eq}}{L}t}\right), & 0 < t < t_0 \\ \dfrac{V_{cc}}{R_{eq}}\left(e^{-\frac{R_{eq}}{L}(t-t_0)} - e^{-\frac{R_{eq}}{L}t}\right), & t_0 \leq t < T \end{cases}$$

When the data receiving and sending inductances are identical, the coupling coefficient is k, and the voltage induced at both ends of the data receiving inductor is:

$$V(t) = kL\frac{dI(t)}{dt} = \begin{cases} 0, & t = 0 \\ -kV_{cc}e^{-\frac{R_{eq}}{L}t}, & 0 < t < t_0 \\ -kV_{cc}\left(e^{-\frac{R_{eq}}{L}(t-t_0)} - e^{-\frac{R_{eq}}{L}t}\right), & t_0 \leq t < T \end{cases}$$

By the same reasoning, when data 0 is transmitted, the voltage polarity at both ends of the digital receiving inductor is:

$$V(t) = kL\frac{dI(t)}{dt} = \begin{cases} 0, & t = 0 \\ -kV_{cc}e^{-\frac{R_{eq}}{L}t}, & 0 < t < t_0 \\ kV_{cc}\left(e^{-\frac{R_{eq}}{L}(t-t_0)} - e^{-\frac{R_{eq}}{L}t}\right), & t_0 \leq t < T \end{cases}$$

Considering the non-idealities of the circuit and the continuity principle, the above equation actually describes that when data 1 is transmitted, the receiving-induced voltage actually shows a rapid rise to the highest positive level at time 0, and shows a slowly decaying positive level from time 0 to $t_0$; the level at point to actually shows a rapid fall from the positive level to the lowest negative level; a slowly decaying negative level is shown after $t_0$. By the same reasoning, when data 0 is transmitted, the receiving-induced voltage actually shows a rapid decrease to the lowest negative level at time 0, a slowly decaying negative level from time 0 to $t_0$, a rapid increase from the negative level to the highest positive level at point to, and a slowly decaying positive level after $t_0$. Therefore, the transmission data can be demodulated by considering the positive and negative characteristics of the receiving-induced voltage from 0 to $t_0$.

The method according to the present disclosure is described below in connection with a specific example, the method including the steps below.

In step 1), the transmitting chip respectively inputs an internal 1 GHz system clock signal and an opposite signal thereof to a clock transmitting H-bridge circuit formed by a pair of inverters; the clock transmitting H-bridge circuit drives the clock transmitting inductor to transmit to the clock receiving inductor of the receiving chip, and induces a periodic voltage signal with the same frequency as the system clock of the transmitting chip; after the signal is amplified by the differential amplifier of the receiving chip, a rectangular wave clock is recovered for use by an internal circuit of the receiving chip.

In step 2), the transmitting chip uses the system clock to generate a rectangular pulse with a 20% duty cycle in the same frequency domain as the system clock.

In step 3), the transmitting chip passes the rectangular pulse wave generated in step 2) in a direction from the positive end to the negative end of the data transmitting inductor all through the data transmitting inductor in the time slot in which the transmission data is 1 (high level). Likewise, the rectangular pulse wave generated in step 2) is completely passed through the data transmitting inductor in a direction from the negative terminal to the positive terminal of the data transmitting inductor in the time slot in which the transmission data is 0 (zero level). In an embodiment where data 1101001 is transmitted sequentially, the current through the data transmitting inductor is plotted as a function of time in FIG. 2, and this current variation can be described as follows:

in a 1 ns time slot for the transmission of 1, $$
I(t) = \begin{cases} 5\left(1 - e^{-3 \cdot 10^{10}t}\right), & 0 < t < 0.2 \text{ ns} \\ 5\left(e^{-3 \cdot 10^{10}(t - 0.2n)} - e^{-3 \cdot 10^{10}t}\right), & 0.2 \text{ ns} \le t < 1 \text{ ns} \end{cases}
$$

in a 1 ns time slot for the transmission of 0, $$
I(t) = \begin{cases} -5\left(1 - e^{-3 \cdot 10^{10}t}\right), & 0 < t < 0.2 \text{ ns} \\ -5\left(e^{-3 \cdot 10^{10}(t - 0.2n)} - e^{-3 \cdot 10^{10}t}\right), & 0.2 \text{ ns} \le t < 1 \text{ ns} \end{cases}
$$

In this example, $V_{cc} = 1.2$V, $R_{eq} \approx 240\Omega$, $L \approx 8$ nH, and $k \approx 0.5$.

Figure 6:
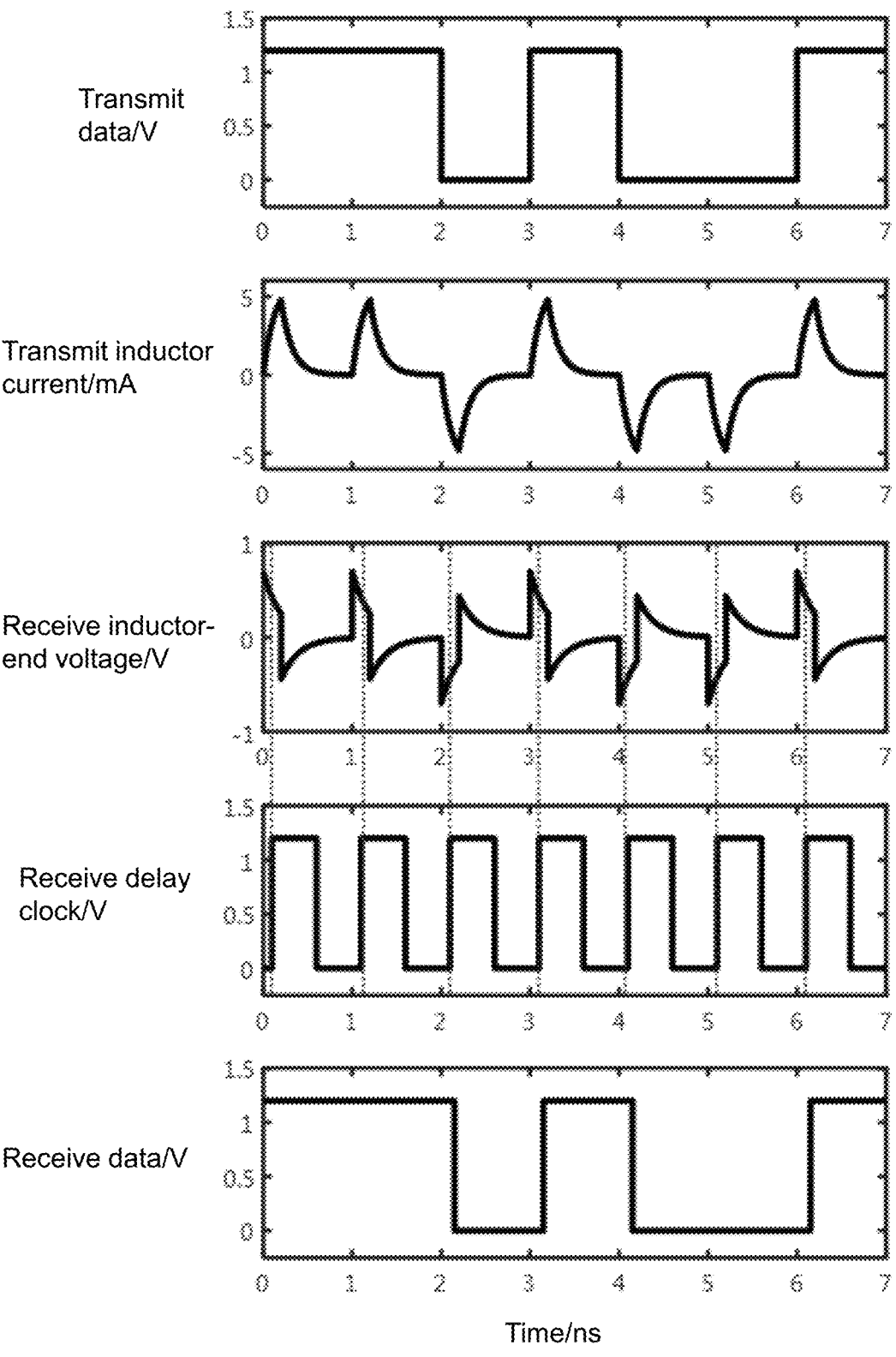
FIG. 6 is a diagram of an embodiment of a wireless inter-chip communication method according to the present disclosure.

In step 4), the data receiving inductor-end voltage in this embodiment is plotted in FIG. 6, and the data receiving inductor-end voltage (assuming polarity) can be described as:

in any 1 ns time slot when the transmitted data is 1, $$
V(t) = \begin{cases} 0, & t = 0 \\ 0.6e^{-3 \cdot 10^{10}t}, & 0 < t < 0.2 \text{ ns} \\ 0.6\left(e^{-3 \cdot 10^{10}t} - e^{-3 \cdot 10^{10}(t - 0.2n)}\right), & 0.2 \text{ ns} \le t < 1 \text{ ns} \end{cases}
$$

in any 1 ns time slot when the transmitted data is 0, $$
V(t) = \begin{cases} 0, & t = 0 \\ -0.6e^{-3 \cdot 10^{10}t}, & 0 < t < 0.2 \text{ ns} \\ -0.6\left(e^{-3 \cdot 10^{10}t} - e^{-3 \cdot 10^{10}(t - 0.2n)}\right), & 0.2 \text{ ns} \le t < 1 \text{ ns} \end{cases}.
$$

In step 5), as shown in a timing sequence of receiving delay clock and receiving inductor-end voltage shown in FIG. 6, the recovery clock of step 1) is passed through the voltage-controlled delay circuit, so that the rising edge of the recovery delay clock inside the receiving chip is synchronized to the central positions of the first and second abrupt change points of the voltage induced on the data receiving inductor in step 4). A dynamic comparator controlled by this synchronous delay clock samples the differentially induced voltage across the data receiving inductor. The analog signal output by the dynamic comparator is sent to an RS latch, and a digital signal 1101001, i.e., a received data signal, is output.

The present disclosure has the following advantageous effects.

1) The present solution makes use of the principle of magnetic coupling in a silicon medium, and can realize wireless clock synchronization and data communication between multiple layers of chips in a vertical direction for three-dimensional stacked chips. The present solution utilizes an on-chip planar spiral inductor that is compatible with standard CMOS technology, which improves the integration degree, facilitates deployment, and reduces the requirement for the accuracy of assembling stacked chips, thus improving the system robustness against stacking misalignment, ambient temperature, and mechanical shock.

2) The present solution uses pulse modulation to avoid the passage of long and large currents through the transmitting inductor, greatly reduces the power consumption and heat generation of the system, and facilitates large-scale deployment of high-performance and energy-efficient computing systems; moreover, this is compatible with high-performance, embedded, edge-computing, and wearable devices with various stringent requirements for power consumption and heat dissipation.

3) The present solution uses full-bit modulation to stabilize the output of pulse signals while the data signal level is free from jumping in a long period, and prevents the crosstalk signals of adjacent channels from being coupled to the receiving-end inductance to generate bit errors. Compared with the prior art, the solution herein has a simpler structure, stronger anti-interference ability, lower bit error rate, and higher channel density, and can achieve three-dimensional stack-chip communications that feature a higher bandwidth, low delay, and low bit error.

What is claimed is:

1. A magnetic coupling-based inter-chip wireless communication interface structure for three-dimensional stacked chips, comprising a master chip and at least one slave chip, wherein the master chip and the at least one slave chip are vertically stacked; the at least one slave chip comprises a clock receiving module, a data transmitting module and a data receiving module; the master chip comprises a clock transmitting module, a data transmitting module, and a data receiving module; on the at least one slave chip and the master chip, the data transmitting modules are identical, and the data receiving modules are identical; the data transmitting module on the at least one slave chip corresponds to the data receiving module on the master chip, and the data receiving module on the at least one slave chip corresponds to the data transmitting module on the master chip; the data transmitting module and the data receiving module that correspond to each other establish a magnetic coupling relationship in a vertical direction between a data transmitting inductor and a data receiving inductor that are parallelly aligned for transmission of a voltage signal;

the clock transmitting module comprises a clock transmitting inductor and a clock transmitting H-bridge; the clock receiving module comprises a clock receiving inductor, a differential amplifier and a clock output buffer chain; the clock transmitting module and the clock receiving module establish a magnetic coupling relationship in a vertical direction between the clock receiving inductor and the clock transmitting inductor that are parallelly aligned for transmission of a voltage signal;

the clock transmitting inductor is connected to an output end of the clock transmitting H-bridge, and an external system clock is input to an input end of the clock transmitting H-bridge; the clock receiving inductor is connected to an input end of the differential amplifier, and a signal amplified by the differential amplifier is output to the clock output buffer chain;

the data transmitting module comprises a rectangular wave pulse generator, a full-bit data modulator, and a data transmitting inductor, wherein the full-bit data modulator comprises an H-bridge controller and a full-bit H-bridge; the data receiving module comprises a data receiving inductor, a voltage-controlled clock delayer, a clocked dynamic comparator, and a latch;

the data transmitting inductor is connected to an output end of the full-bit data modulator, and a pulse generated by the rectangular wave pulse generator and a data signal to be transmitted are input to the full-bit data modulator; an output of the clock receiving module is connected to the voltage-controlled clock delayer, and an output delay clock signal of the voltage-controlled clock delayer and a signal received by the data receiving inductor are together output to the clocked dynamic comparator; the clocked dynamic comparator is connected to the latch and outputs a recovered data signal.

2. The magnetic coupling-based inter-chip wireless communication interface structure for three-dimensional stacked chips according to claim 1, wherein the data transmitting inductor, the data receiving inductor, the clock transmitting inductor and the clock receiving inductor are made of a top metal of the chip, and the data transmitting inductor, the data receiving inductor, the clock transmitting inductor and the clock receiving inductor are rectangular or octagonal planar spiral inductors with a self-resonant frequency higher than a transmitting frequency.

3. The magnetic coupling-based inter-chip wireless communication interface structure for three-dimensional stacked chips according to claim 1, wherein the clock transmitting H-bridge comprises a symmetrical pair of inverters; both ends of the clock transmitting inductor are respectively connected to output ends of the pair of inverters of the clock transmitting H-bridge; the pair of inverters is driven by a pair of differential rectangular wave system clocks.

4. The magnetic coupling-based inter-chip wireless communication interface structure for three-dimensional stacked chips according to claim 1, wherein the full-bit H-bridge is composed of two pairs of fully symmetric PMOS and NMOS with drains connected, wherein a source of the PMOS is connected to a power supply and a source of the NMOS is connected to ground; the H-bridge controller is connected to four gate input ends of the PMOS and NMOS on left and right arms of the full-bit H-bridge; a complementary signal to the data signal to be transmitted is input into a PMOS gate on the left arm; the data signal to be transmitted is directly connected to the PMOS gate on the right arm; the data signal to be transmitted and a rectangular wave pulse generated by the rectangular wave pulse generator are output to a NMOS gate on the left arm via a NOR gate; an opposite signal of the data signal to be transmitted and an opposite signal of the generated rectangular wave pulse are output to the NMOS gate on the right arm via the NOR gate.

5. The magnetic coupling-based inter-chip wireless communication interface structure for three-dimensional stacked chips according to claim 1, wherein the voltage-controlled clock delayer is a delay circuit where voltage controls delay time or phase without changing a signal frequency and a duty cycle.

6. The magnetic coupling-based inter-chip wireless communication interface structure for three-dimensional stacked chips according to claim 1, wherein the clocked dynamic comparator is a high-speed comparator for implementing a pre-charging state and comparing differential inputs of a state flow in a working cycle controlled by high and low levels of a clock; a polarity and magnitude of an output differential level of the clocked dynamic comparator are positively related to the magnitude and magnitude of an amplitude difference of an input differential signal in a comparison state.

7. A magnetic coupling-based inter-chip wireless communication method for three-dimensional stacked chips applied to the interface structure according to claim 1, comprising:

step 1), inputting an external system clock signal to the clock transmitting H-bridge of the master chip, sensing a periodic voltage signal with a same frequency as a system clock of the master chip by the clock receiving inductor of the at least one slave chip, and amplifying the periodic voltage signal by differential amplifier of the at least one slave chip to recover the rectangular wave system clock; and step 2), sending the data signal from the data transmitting module of the master chip to the data receiving module of the at least one slave chip, or sending from the data transmitting module of the at least one slave chip to the data receiving module of the master chip, wherein the master chip or at least one slave chip for transmitting data is referred to as a transmitting chip, the at least one slave chip or master chip for receiving data is referred to as a receiving chip, and a process of sending the data signal comprises:

2.1), using a transmitting chip clock to generate, by the data transmitting module of the transmitting chip, a rectangular pulse wave with a same frequency as the transmitting chip clock and a duty ratio of less than 50%;

2.2), passing the rectangular pulse wave generated by the transmitting chip in step 2.1) in a direction from a positive end to a negative end all through the data transmitting inductor therein by the data transmitting module of the transmitting chip in a time slot where the data to be transmitted is of a high level; likewise, in the time slot where the data to be transmitted is of a zero level, passing the rectangular pulse wave generated by the transmitting chip in step 2.1) all through the data transmitting inductor in a direction from the negative end to the positive end; and 2.3), passing a receiving chip clock through the voltage-controlled clock delayer by the receiving chip, so that a rising edge of the delay clock inside the receiving chip is synchronized to somewhere between first and second abrupt change points of an induced voltage on the data receiving inductor thereof; determining, by the clocked dynamic comparator of the receiving chip controlled by a synchronous delay clock, positive and negative nature of a differential induced voltage at both ends of the data receiving inductor, and outputting a comparison result as an analogue signal; sending the analogue signal output by the clocked dynamic comparator of the receiving chip to the latch of the receiving chip, and outputting a digital signal, which is the data signal received by the receiving chip.

8. The magnetic coupling-based inter-chip wireless communication method for three-dimensional stacked chips according to claim 7, wherein when the data signal is sent from the data transmitting module of the master chip to the data receiving module of the at least one slave chip, the transmitting chip clock in step 2.1) is an external system clock input to the master chip; the receiving chip clock in step 2.3) is the rectangular wave system clock recovered by the at least one slave chip in step 1);

when the data signal is sent from the data transmitting module of the at least one slave chip to the data receiving module of the master chip, the transmitting chip clock in step 2.1) is the rectangular wave system clock recovered by the at least one slave chip in step 1); the receiving chip clock in step 2.3) is an external system clock input to the master chip.

9. The magnetic coupling-based inter-chip wireless communication method for three-dimensional stacked chips according to claim 7, wherein a modulation current I(t) flowing in the data transmitting inductor and the induced voltage V(t) of the data receiving inductor are described by the following equation in a rectangular pulse wave period:

$$I(t) = \begin{cases} \pm \dfrac{V_{cc}}{R_{eq}}\left(1 - e^{-\frac{R_{eq}}{L}t}\right), & 0 < t < t_0 \\ \pm \dfrac{V_{cc}}{R_{eq}}\left(e^{-\frac{R_{eq}}{L}(t-t_0)} - e^{-\frac{R_{eq}}{L}t}\right), & t_0 \le t < T \end{cases}$$

-continued $$V(t) = \begin{cases} 0, & t = 0 \\ \pm k V_{cc} e^{-\frac{R_{eq}}{L}t}, & 0 < t < t_0 \\ \pm k V_{cc}\left(e^{-\frac{R_{eq}}{L}t} - e^{-\frac{R_{eq}}{L}(t-t_0)}\right), & t_0 \le t < T \end{cases}$$

where when the transmission data is of a high level, all the "±" signs above are taken as "+", and when the transmission data is of a zero level, all the "±" signs above are taken as "−"; a power supply voltage is $V_{cc}$; the data transmitting inductance and the data receiving inductance are identical, and a coupling coefficient is k; a model of data transmitting inductance and data receiving inductance is considered as a complex of an ideal inductance L and a small resistance R in series; a conductive loop of a full-bit H-bridge is considered to be a series connection of two ideal switches and two switch MOS transistor internal resistances, and a sum of the switch transistor internal resistance and the resistance R is $R_{eq}$; a period of the rectangular pulse wave generated by the transmitting chip in step 2.1) is T, and $t_0$ is a high-level time length within one period of this rectangular pulse wave.

\*    \*    \*    \*    \*